(12) United States Patent
Ouyang et al.

(10) Patent No.: US 9,780,007 B2
(45) Date of Patent: Oct. 3, 2017

(54) LCR TEST CIRCUIT STRUCTURE FOR DETECTING METAL GATE DEFECT CONDITIONS

(75) Inventors: Xu Ouyang, Hopewell Junction, NY (US); Yunsheng Song, Poughkeepsie, NY (US); Tso-Hui Ting, Stormville, NY (US); Yongchun Xin, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1675 days.

(21) Appl. No.: 13/343,080

(22) Filed: Jan. 4, 2012

(65) Prior Publication Data

US 2013/0169308 A1   Jul. 4, 2013

(51) Int. Cl.
| | |
|---|---|
| G01R 31/02 | (2006.01) |
| G01R 31/26 | (2014.01) |
| H01L 21/66 | (2006.01) |
| G01R 31/28 | (2006.01) |

(52) U.S. Cl.
CPC .......... *H01L 22/34* (2013.01); *G01R 31/2858* (2013.01); *H01L 2924/0002* (2013.01)

(58) Field of Classification Search
CPC ....... H01L 2924/14; H01L 2924/13091; H01L 2924/30107; H01L 25/0657; G01R 31/2851
USPC ........................ 324/762.03, 500, 537, 762.01
See application file for complete search history.

(56) References Cited

U.S. PATENT DOCUMENTS

| | | | |
|---|---|---|---|
| 4,406,991 A * | 9/1983 | Strycula | H03H 7/01 333/167 |
| 4,565,966 A | 1/1986 | Burr et al. | |
| 4,987,009 A * | 1/1991 | Nakamura | H01L 27/016 257/E27.116 |
| 5,189,306 A | 2/1993 | Frei | |
| 5,198,713 A * | 3/1993 | Suzuta | B06B 1/0207 310/316.01 |
| 5,266,901 A | 11/1993 | Woo | |

(Continued)

FOREIGN PATENT DOCUMENTS

| | | |
|---|---|---|
| JP | 2004184257 A | 7/2004 |
| JP | 2005210146 A | 8/2005 |

OTHER PUBLICATIONS

U.S. Appl. No. 12/539,732; Non-Final Office Action; Date Filed: Aug. 12, 2009; Date Mailed: May 14, 2012; pp. 1-12.

(Continued)

*Primary Examiner* — Giovanni Astacio-Oquendo
(74) *Attorney, Agent, or Firm* — Yuanmin Cai; Hoffman Warnick LLC

(57) ABSTRACT

A test structure for an integrated circuit device includes a series inductor, capacitor, resistor (LCR) circuit having one or more inductor elements, with each inductor element having at least one unit comprising a first segment formed in a first metal layer, a second segment connecting the first metal layer to a semiconductor substrate beneath the first metal layer, and a third segment formed in the semiconductor substrate; and a capacitor element connected in series with each inductor element, the capacitor element defined by a transistor gate structure including a gate electrode as a first electrode, a gate dielectric layer, and the semiconductor substrate as a second electrode.

15 Claims, 6 Drawing Sheets

(56) References Cited

U.S. PATENT DOCUMENTS

| | | | |
|---|---|---|---|
| 5,436,183 A * | 7/1995 | Davis | H01L 27/0266 257/360 |
| 5,539,306 A | 7/1996 | Riggio, Jr. | |
| 5,808,587 A * | 9/1998 | Shima | G07C 9/00103 340/10.34 |
| 6,054,858 A * | 4/2000 | Dumoulin | G01R 33/3628 324/314 |
| 6,297,644 B1 | 10/2001 | Jarvis et al. | |
| 6,452,412 B1 | 9/2002 | Jarvis et al. | |
| 6,472,962 B1 * | 10/2002 | Guo | H01G 5/16 200/181 |
| 6,509,197 B1 | 1/2003 | Satya et al. | |
| 6,544,802 B1 | 4/2003 | Jun et al. | |
| 6,693,446 B2 * | 2/2004 | Song | G01R 31/2853 257/84 |
| 6,815,959 B2 | 11/2004 | Johnson et al. | |
| 6,861,666 B1 | 3/2005 | Weiner et al. | |
| 6,921,672 B2 | 7/2005 | Satya et al. | |
| 7,026,175 B2 | 4/2006 | Li et al. | |
| 7,081,758 B2 | 7/2006 | Umemura et al. | |
| 7,340,703 B2 | 3/2008 | Hegazy et al. | |
| 7,456,636 B2 | 11/2008 | Patterson et al. | |
| 7,474,107 B2 | 1/2009 | Patterson et al. | |
| 7,518,190 B2 | 4/2009 | Cote et al. | |
| 7,579,670 B2 * | 8/2009 | Shastri | H01F 17/0006 257/531 |
| 7,592,827 B1 | 9/2009 | Brozek | |
| 7,683,644 B2 | 3/2010 | Filippi et al. | |
| 7,733,109 B2 | 6/2010 | Ahsan et al. | |
| 7,795,879 B2 | 9/2010 | Watanabe | |
| 7,927,895 B1 | 4/2011 | Lavoie et al. | |
| 8,039,837 B2 | 10/2011 | Patterson et al. | |
| 2002/0117696 A1 | 8/2002 | Hirai et al. | |
| 2003/0096436 A1 | 5/2003 | Satya et al. | |
| 2005/0082664 A1 | 4/2005 | Funaba et al. | |
| 2006/0158282 A1 * | 7/2006 | Chen | H03H 7/0115 333/185 |
| 2006/0192904 A1 | 8/2006 | Almogy et al. | |
| 2008/0032429 A1 | 2/2008 | Chen et al. | |
| 2008/0100831 A1 | 5/2008 | Patterson et al. | |
| 2008/0191258 A1 * | 8/2008 | Jia | H01L 29/94 257/306 |
| 2008/0217612 A1 | 9/2008 | Patterson et al. | |
| 2008/0237586 A1 | 10/2008 | Sun et al. | |
| 2008/0258840 A1 * | 10/2008 | Sato | H01P 1/20 |
| 2009/0057644 A1 | 3/2009 | Shin et al. | |
| 2009/0096461 A1 | 4/2009 | Ahsan et al. | |
| 2009/0171644 A1 * | 7/2009 | Chidambarrao | G06F 17/5036 703/14 |
| 2010/0279436 A1 | 11/2010 | Fu et al. | |
| 2014/0374742 A1 * | 12/2014 | Tsang | H01L 25/167 257/43 |

OTHER PUBLICATIONS

J.C. Lee, C.H. Chen, D. Su, J.H. Chuang, "Investigation of Sensitivity Improvement on Passive Voltage Contrast Defect Isolation", Microelectronics Reliability, vol. 42, No. 9-11, pp. 1707-1710, 2002.

M. Matsui, T. Odaka, H. Nagaishi, K. Sakurai, "Quantitative Measurement of Voltage contrast in SEM Images for In-Line Resistance Inspection of Wafers Manufactured for SRAM", Proceedings of the SPIE—The International Society for Optical Engineering, vol. 7272, pp. 72721D (8 pages), 2009.

M. Matsui, Z. Cheng, M. Nozoe, K. Torli, "Detecting Defects in Cu Metallization Structures by Electron-Beam Wafer Inspection", Journal of the Eletrochemical Society, vol. 151, No. 6, pp. G440-2, 2004.

M. Javed et al., "RLC Circuit Response and Analysis (Using State Space Method)," IJCSNS International Journal of Computer Science and Network Security; vol. 8, No. 4, pp. 48-54, Apr. 2008.

EE Times, [online]; [retrieved on Oct. 18, 2011]; retrieved from the Internet http://eetimes.com/design/communications-design/4017914/Accurate-Modeling-of-Spiral-Inductors-on-Silicon-for-Wireless-RFIC-Designs Jan Van Hese, "Accurate Modeling of Spiral Inductors on Silicon for Wireless RFIC Designs," EE Times-Design; pp. 1-9; 2001.

Renee T. Mo; pending U.S. Appl. No. 13/013,133 entitled, "Test Structure for Detection of Gap in Conductive Layer of Multilayer Gate Stack,"; filed: Jan. 25, 2011.

Zhao et al.,"Fault-Coverage Analysis Techniques of Crosstalk in Chip Interconnects," IEEE Transactions on Computer-Aided Design of Integrated Circuits and Systems; vol. 22, No. 6, p. 770-782, Jun. 2003.

O.D. Patterson, H. Wildman, D. Gal, K. Wu, "Detection of Resistive Shorts and Opens Using Voltage Contrast Inspection", Micro, vol. 24, No. 5, pp. 67-68, 2006.

T. Sakai, N. Oda, T. Yokoyama, H. Kikuchi, H. Kitajima, "Defect Isolation and Characterization in Contact Array/Chain Structures by Using Voltage Contrast Effect", Conference Proceedings of IEEE International Symposium on Semiconductor Manufacturing Conference, Santa Clara, CA, Oct. 11-13, 1999., pp. 195-198.

* cited by examiner

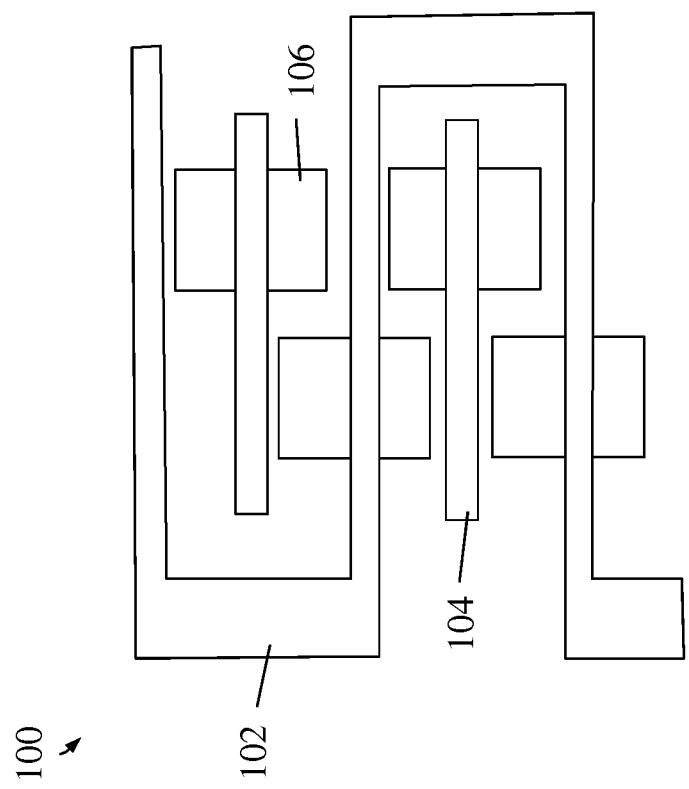
Figure 1 – Prior Art

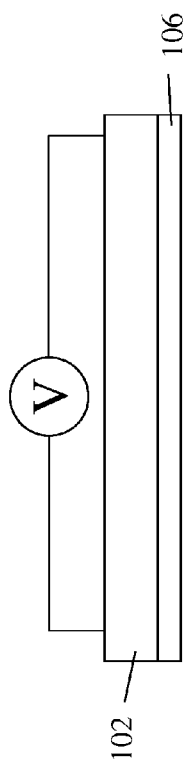
Figure 2(a) – Prior Art
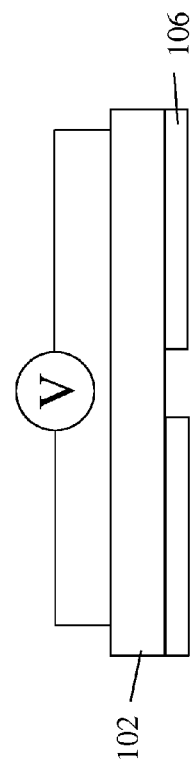
Figure 2(b) – Prior Art
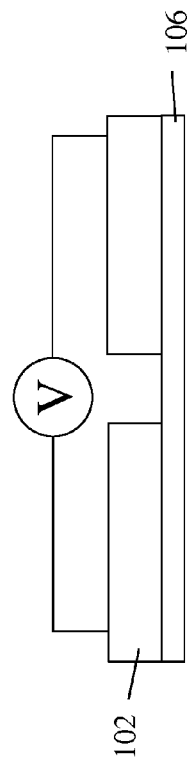
Figure 2(c) – Prior Art

LCR TEST CIRCUIT STRUCTURE FOR DETECTING METAL GATE DEFECT CONDITIONS

BACKGROUND

The present invention relates generally to semiconductor device manufacturing and, more particularly, to an LCR (inductor, capacitor, and resistor) test circuit structure for detecting metal gate defect conditions found in integrated circuits using metal gate transistors.

Semiconductor structures are now employing high-k metal gate stacks because they provide better performance at lower power and may avoid leakage resulting from device scaling. Hafnium-containing dielectrics are being used as gate dielectrics with the gate dielectric covered by a conductive layer such as titanium nitride (TiN) to protect it during high temperature deposition process of silicon (Si). The conductive layer is then covered by other semiconductor materials, such as a polysilicon layer or an amorphous silicon layer, and may be capped by a silicide cap layer. The gate stack is surrounded by a spacer material. Thus, the conductive layer is typically sealed by the spacer material of the structure. Aggressive cleaning processes are typically used after the spacer formation process.

One drawback associated with such a high-k metal gate (HKMG) fabrication process is that if a seal is violated and a path exists to the conductive layer, the conductive layer may be removed during the manufacturing process. If such an event occurs, the semiconductor device may not work properly. The detection of a gap in the conductive layer may be challenging using conventional optical or laser-based, voltage contrast (VC), or probe-able inspection techniques, because the conductive layer may be covered by other semiconductor material layers. On the other hand, existing test structures incorporated into the manufacturing process tend to have relatively small sensitivity, and may not effectively discriminate between missing metal and missing silicon.

SUMMARY

In an exemplary embodiment, a test structure for an integrated circuit device includes a series inductor, capacitor, resistor (LCR) circuit having one or more inductor elements, with each inductor element having at least one unit comprising a first segment formed in a first metal layer, a second segment connecting the first metal layer to a semiconductor substrate beneath the first metal layer, and a third segment formed in the semiconductor substrate; and a capacitor element connected in series with each inductor element, the capacitor element defined by a transistor gate structure including a gate electrode as a first electrode, a gate dielectric layer, and the semiconductor substrate as a second electrode.

In another embodiment, a test structure for an integrated circuit device includes an inductor, capacitor, resistor (LCR) circuit comprising a repeating plurality of series connected inductor-capacitor-resistor circuit elements, with each inductor element having at least one unit comprising a first segment formed in a first metal layer, a second segment connecting the first metal layer to a semiconductor substrate beneath the first metal layer, and a third segment formed in the semiconductor substrate; and each capacitor element defined by a transistor gate structure including a gate electrode as a first electrode, a gate dielectric layer, and the semiconductor substrate as a second electrode.

In another embodiment, a method of testing an integrated circuit device for metal gate defects includes applying a test signal to a series inductor, capacitor, resistor (LCR) circuit under test. The LCR circuit under test includes one or more inductor elements, with each inductor element having at least one unit comprising a first segment formed in a first metal layer, a second segment connecting the first metal layer to a semiconductor substrate beneath the first metal layer, and a third segment formed in the semiconductor substrate; and a capacitor element connected in series with each inductor element, the capacitor element defined by a transistor gate structure including a gate electrode as a first electrode, a gate dielectric layer, and the semiconductor substrate as a second electrode. The method further includes determining, based on one or more of measured current and impedance, whether the LCR circuit under test has a reduction in capacitance of one or more of the capacitor elements, with respect to a nominal capacitance of a known, non-defective LCR circuit, wherein the test signal is applied at a resonant frequency of the known, non-defective LCR circuit; and wherein a determined reduction in capacitance of one or more of the capacitor elements is indicative of a metal gate defect within the LCR circuit under test.

BRIEF DESCRIPTION OF THE SEVERAL VIEWS OF THE DRAWINGS

Referring to the exemplary drawings wherein like elements are numbered alike in the several Figures:

FIG. 1 is a top view of an existing test structure for detecting missing metal gate material;

FIG. 2(a) is a schematic side view of the operation of the test structure of FIG. 1 where no defects are present;

FIG. 2(b) is a schematic side view of the operation of the test structure of FIG. 1 with missing gate metal;

FIG. 2(c) is a schematic side view of the operation of the test structure of FIG. 1 with missing silicon, indicative of a false positive of missing gate metal;

DETAILED DESCRIPTION

Figure 3:
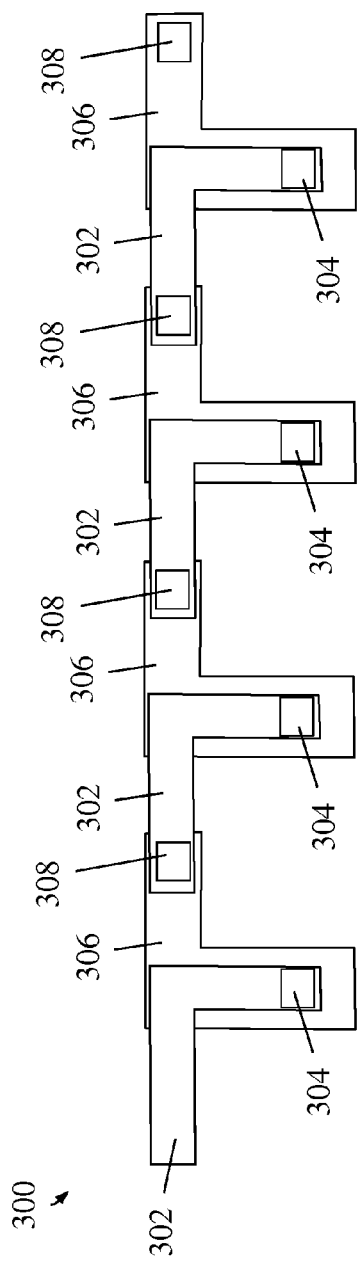
FIG. 3 is a top view of an inductor structure for use with an LCR test circuit, in accordance with an exemplary embodiment.

In the manufacture of transistor devices having metal gate stacks, particularly with gate first process flows, missing metal such as titanium nitride (TiN) can be difficult to accurately detect without the availability of a sensitive test macro to monitor this condition. As indicated above, present efforts in this regard utilize an unsilicided polysilicon serpentine test structure to monitor missing gate metal (e.g., TiN) wherein the serpentine resistance is determined by the TiN material. An example of such a test structure 100 is illustrated in FIG. 1, which includes a serpentine segment 102 and straight segments 104 of an unsilicided polysilicon material, portions of which are formed over metal layers 106 of a test gate structure.

The test structure 100 is limited in that it has a relatively small sensitivity, wherein measured resistance of the structure under a defect condition is only about 2 to 3 times that of the structure resistance where no defects are present. Moreover, the test structure is generally incapable of discriminating between missing polysilicon and missing TiN. For example, in the schematic diagrams of FIG. 2(a) through 2(c), FIG. 2(a) depicts a situation where no defects in the TIN metal gate layer 106 are present. An applied voltage across the polysilicon serpentine structure leads to a low resistance measurement indicative of a non-defective metal gate layer condition. In FIG. 2(b), a gap or break in the metal gate layer 106 will result in a higher resistance measurement (again about 2 to 3 times higher than in FIG. 2(a)). However, in FIG. 2(c) where there is no metal gate layer defect, but rather a break in the polysilicon structure 102, there will be a false positive indication of a metal defect since the missing polysilicon will also lead to a higher resistance measurement, similar to that in FIG. 2(b).

Accordingly, disclosed herein is an LCR test circuit structure for detecting metal gate defect conditions. In embodiments described below, the LCR circuit structure includes the formation of one or more inductors at the substrate/via/first metal level region of a semiconductor device. The LCR test circuit further utilizes the gate structure itself as a capacitive element in the circuit. With such an LCR test circuit structure, a metal gate formation defect, such as missing metal or an encroachment of silicide material for example, will cause a change in the nominal gate capacitance. This in turn will cause a decrease in current flowing through the LCR due to a deviation in resonant frequency from a nominal, non-defective gate capacitance.

Referring now to FIG. 3, there is shown a top view of an inductor structure 300 for use with an LCR test circuit, in accordance with an exemplary embodiment. As is shown, the inductor structure 300 features a basic unit or turn that includes a first segment 302, a second segment 304, and a third segment 306 formed in the front end of line (FEOL) and middle end of line (MEOL) regions of a semiconductor device. More specifically, the first segment 302 includes a substantially L-shaped wire structure formed in a first metal level (M1) region of a semiconductor device. Exemplary materials for the first segment include, for example, aluminum, copper, or any combinations of metals used in wiring layers of semiconductor devices. An end of the first segment is connected to the second segment 304, which is a vertically disposed via or stud (also known in the art as a contact area or "CA" contact). The second segment 304 (which may be tungsten, titanium, copper, or any suitable via material in the art) conductively connects the first segment 302 in the M1 level to the third segment 306 in the substrate or "RX" level of the semiconductor device. The third segment 306, also depicted as being substantially L-shaped, may be a semiconductor material, such as silicon for example, that is suitably doped with a dopant material.

In the exemplary embodiment depicted, the inductor structure 300 includes several loops or turns, in which adjacent units of first, second and third segments are connected to one another by additional segments or vias 308. Depending upon the value of inductance desired, the number of loops or turns may be varied, and it will be appreciated that the specific number of turns used may be more or less than what is depicted in the figures.

Figure 4:
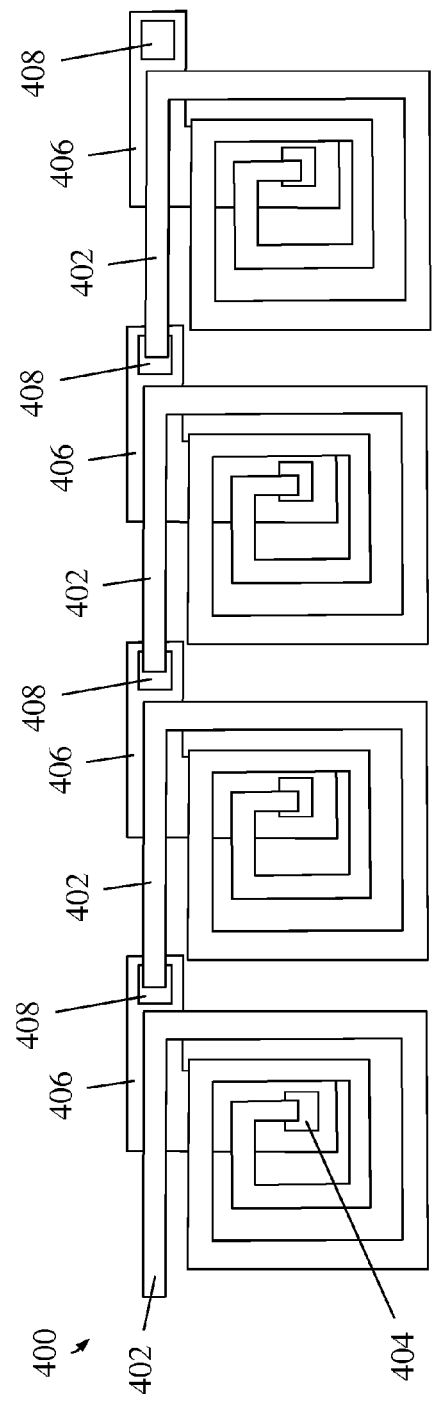
FIG. 4 is a top view of an inductor structure for use with an LCR test circuit, in accordance with another exemplary embodiment.

FIG. 4 illustrates a top view of an inductor structure 400 for use with an LCR test circuit, in accordance with another exemplary embodiment. The structure 400 is similar to the structure 300 of FIG. 3, in that the inductor structure 400 features a basic unit or turn that includes a first segment 402, a second segment 404, and a third segment 406 respectively formed in M1, CA, and RX regions of a semiconductor device. Here, it will be seen that in lieu of an L-shaped first segment in the M1 region, structure 400 includes a spiral shaped first segment 402. As compared to the L-shaped first segment 302 of FIG. 3, the spiral shaped first segment 402 of FIG. 4 provided an increased value of inductance as a result of the multiple turns of the segment. This basic unit, loop or turn 402/404/406 can be connected to any number of additional units through an additional vertical segment(s) 408.

Figure 5:
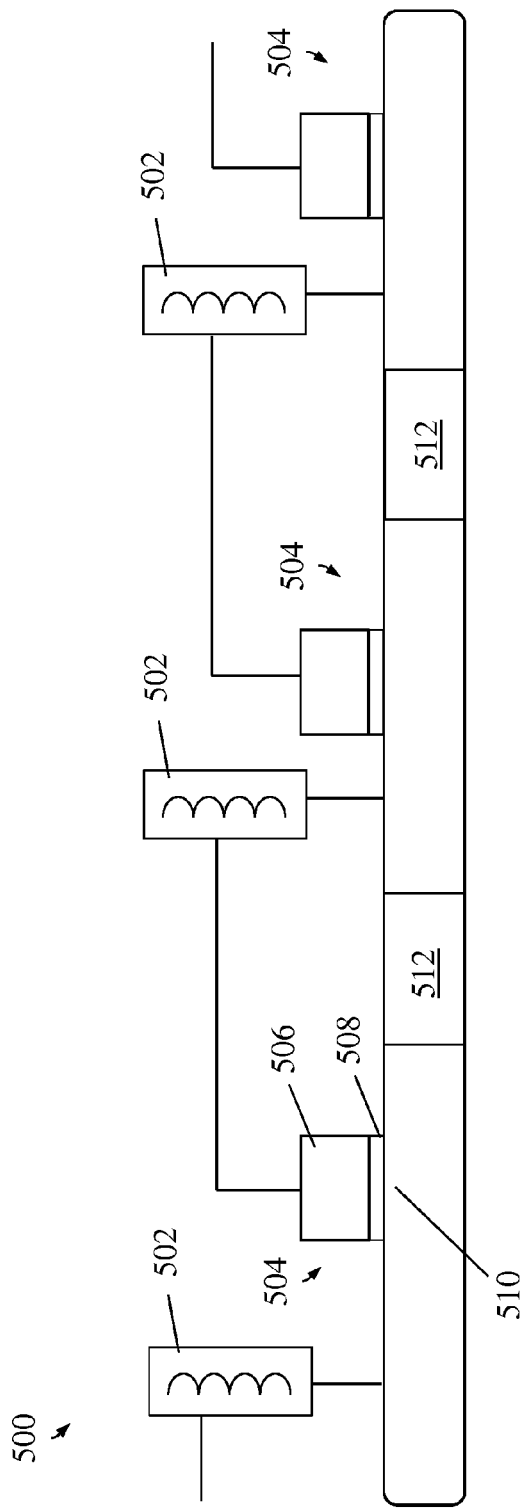
FIG. 5 is a schematic side view of a series LCR test circuit, in accordance with another exemplary embodiment.

Referring now to FIG. 5, there is shown a schematic side view of a series LCR test circuit 500, in accordance with another exemplary embodiment. The test circuit 500 includes a repeating series of inductor-capacitor-resistor circuit elements in which the inductor element 502 is depicted as being schematically connected in series with a capacitor structure 504. The capacitor structure 504 in turn includes a gate electrode 506 (e.g., metal, polysilicon) serving as a first capacitor electrode, a gate dielectric layer 508 serving as the capacitor electrode and a doped substrate 510 serving as a second capacitor electrode. Portions of the substrate between adjacent inductor-capacitor-resistor circuit elements include shallow trench isolation (STI) regions. The inductor structures 502 may be embodied by structures such as described with reference to FIGS. 3 and 4, where the inductor 502 includes at least an M1 segment, a CA contact, and a substrate (RX) region. The series resistance of an LCR circuit element is determined by the series resistance of the M1 metal, CA metal and substrate semiconductor material.

Figure 6:
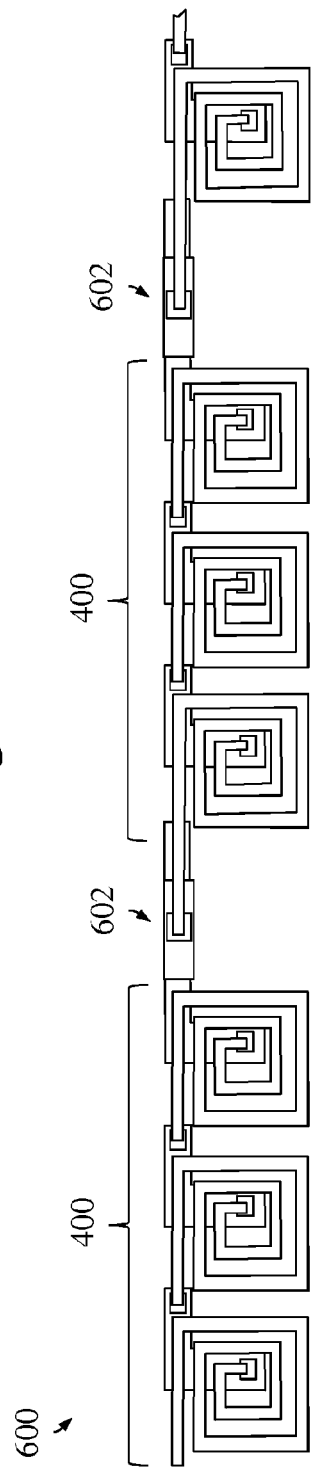
FIG. 6 is a top view of a series LCR test circuit incorporating the inductor structure of FIG. 4, in accordance with another exemplary embodiment.

One exemplary structural implementation of a series LCR test circuit is illustrated in the top view of FIG. 6. As is shown, the series LCR test circuit 600 incorporates the spiral shaped inductor structure 400 depicted in FIG. 4 as the inductor element, which is connected in series with a gate capacitor 602. The test circuit 600 may include any number of additional inductor 400/capacitor 602 units as desired.

For an LCR circuit having a single inductor, capacitor and resistor component, the voltage across the elements as a function of time is given by the expression:

$$V(t) = V_0 e^{j\omega t};$$

where $\omega$ is the frequency of the applied voltage, and $V_0$ is the nominal peak AC input voltage. The magnitude of current through the LCR circuit (having an inductance L, a capacitance C, and a resistance R), as a function of input frequency is given by the expression:

$$|I(\omega)| = \frac{V_0}{\sqrt{R^2 + \left(\omega L - \frac{1}{\omega C}\right)^2}};$$

when $$\omega = \omega_0 = \frac{1}{\sqrt{LC}}$$

(i.e., the resonance frequency), $$|I| = \frac{V_0}{R}.$$

For a series LCR circuit having a total number, N, of series LCR elements, the series impedance, $Z(\omega)$, as a function of frequency, is given by the expression:

$$Z(\omega) = \sum_{i=0}^{N}\left(R_i + j\omega L_i + \frac{1}{j\omega C_i}\right) = \sum_{i=0}^{N} R_i + \sum_{i=0}^{N} j\left(\omega L_i - \frac{1}{\omega C_i}\right)$$

Figure 7:
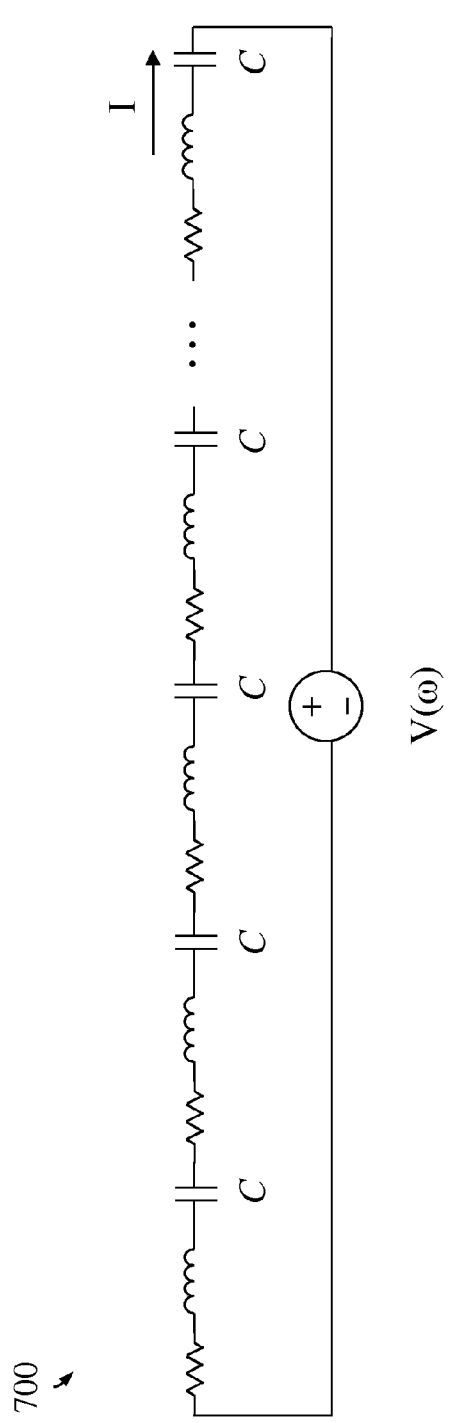
FIG. 7 is a schematic circuit diagram of an LCR test circuit having no missing metal defects.

It will be noted that for a series LCR circuit with no defects (more specifically, with no defects with respect to gate capacitance due to missing metal for example), the distribution or variation, $\Delta C_i$, of the individual values of capacitance from gate to gate is very small compared to the total nominal capacitance C of a given gate. Such a non-defective circuit 700 is schematically illustrated in FIG. 7. In terms of series impedance, then:

$$Z(\omega) = \sum_{i=0}^{N}\left(R_i + j\omega L_i + \frac{1}{j\omega(C + \Delta C_i)}\right)$$

$$= \sum_{i=1}^{N} R_i + \sum_{i=1}^{N} j\left(\omega(L + \Delta L_i) - \frac{1}{\omega(C + \Delta C_i)}\right)$$

$$\approx \sum_{i=1}^{N} R_i + \sum_{i=1}^{N} j\left(\omega(L + \Delta L_i) - \frac{1}{\omega}\left(\frac{1}{C} + \frac{\Delta C_i}{C^2}\right)\right)$$

$$= \sum_{i=1}^{N} R_i + j\left[N\left(\omega L - \frac{1}{\omega C}\right) + \sum_{i=1}^{N}\left(\omega \Delta L_i + \frac{\Delta C_i}{\omega C^2}\right)\right]$$

$$Z(\omega_0) \approx \sum_{i=1}^{N} R_i = R,$$

at resonance frequency $$\omega_0 = \frac{1}{\sqrt{LC}}.$$

Figure 8:
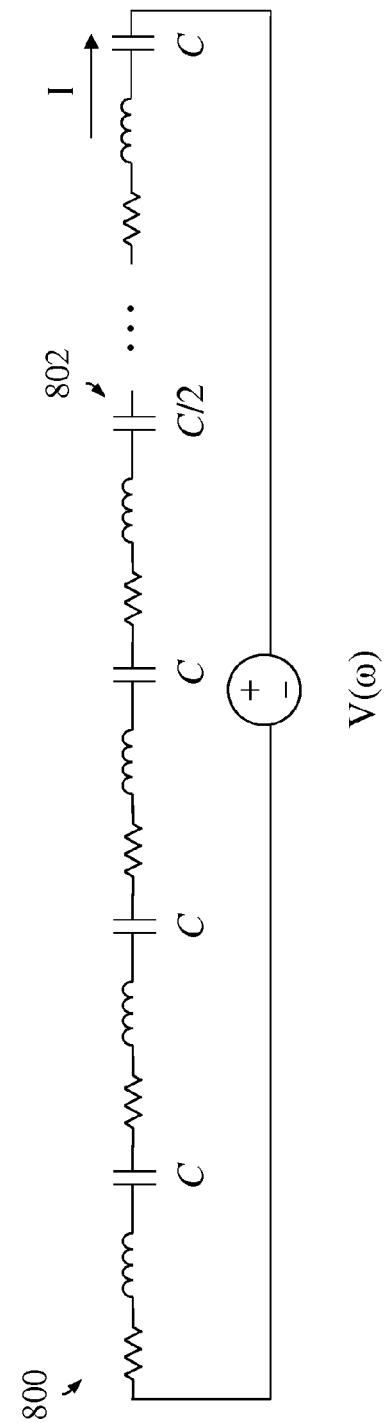
FIG. 8 is a schematic circuit diagram of an LCR test circuit having a missing metal defect and reduced capacitance.

In other words, for a normal distribution of processing conditions, the deviation in individual capacitances (above and below the nominal value) should zero out for a sufficiently large number, N, of series LCR elements where no metal gate defects are present. On the other hand, for a series LCR circuit having a missing metal defect, the result may be one or more LCR elements having a capacitance that is perhaps half or less the capacitance of a non-defective device. Such a defective circuit 800 is schematically illustrated in FIG. 8, which includes at least one defective gate structure 802 with a reduced capacitance. In this case:

$$Z(\omega) \approx \sum_{i=1}^{N} R_i + \sum_{i=1}^{N-1} j\left(\omega(L + \Delta L_i) - \frac{1}{\omega}\left(\frac{1}{C} - \frac{\Delta C_i}{C^2}\right)\right) +$$

-continued $$j\left(\omega(L + \Delta L_{def}) - \frac{2}{\omega C}\right)$$

$$= \sum_{i=1}^{N} R_i + j\left(N\left(\omega L - \frac{1}{\omega C}\right) + \sum_{i=1}^{N}\left(\omega \Delta L_i + \frac{\Delta C_i}{\omega C^2}\right) - \frac{1}{\omega C}\right)$$

$$\approx \sum_{i=1}^{N} R_i + j\left(N\left(\omega L - \frac{1}{\omega C}\right) - \frac{1}{\omega C}\right)$$

Thus, at $$\omega = \omega_0 = \frac{1}{\sqrt{LC}}, |Z| = \sqrt{R^2 + \frac{L}{C}}.$$

That is, the test circuit current depends on both R and $$\frac{L}{C}.$$

If the inductors of the series LCR circuit are designed so as to have a sufficiently large inductance to capacitance ratio, e.g., $$\frac{L}{C} \approx 100 R^2,$$

then the output current measured for a defective (missing metal) circuit such as in FIG. 8 may be on the order of about 10 times lower than the output current measured for a non-defective LCR circuit. In terms of device parameters, an LCR circuit element may have a series resistance of about 20 ohms ($\Omega$) with a characteristic CA via cross sectional width/length of about 40 nanometers (nm). In addition, for 32 nm, silicon-on-insulator (SOI) gate designs, the nominal gate capacitance is on the order of about 2-3 fF/$\mu$m² (femtofarads per square micron). With respect to inductance, for a rectangle shaped inductor element (FIG. 4):

$$L_{rect} \approx N^2 \frac{\mu_0 \mu_r}{\pi}\left[-2(w+h) + 2\sqrt{h^2+w^2} - h\ln\left(\frac{h+\sqrt{h^2+w^2}}{w}\right) - w\ln\left(\frac{w+\sqrt{h^2+w^2}}{h}\right) + h\ln\left(\frac{2h}{a}\right) + w\ln\left(\frac{2w}{a}\right)\right]$$

wherein $\mu_0$ is magnetic permeability of free space, $\mu_r$ is relative magnetic permeability of the inductor material, N is (the number of turns of the inductor?), h is the length of one side of rectangle and w is the length of the other side of rectangle. If the inductor is square shaped, then h is equal to w.

Selecting, for this simple inductor design, exemplary values of w=30 $\mu$m, N=150 (assuming an M1 ground rule is applied such that the space/width limit of the M1 line is 50 nm/50 nm), then L$\approx$2×10⁻⁷ H. Consequently, $$\frac{L}{R^2 C} \approx 96,$$

which is sufficient for testing purposes.

Figure 9:
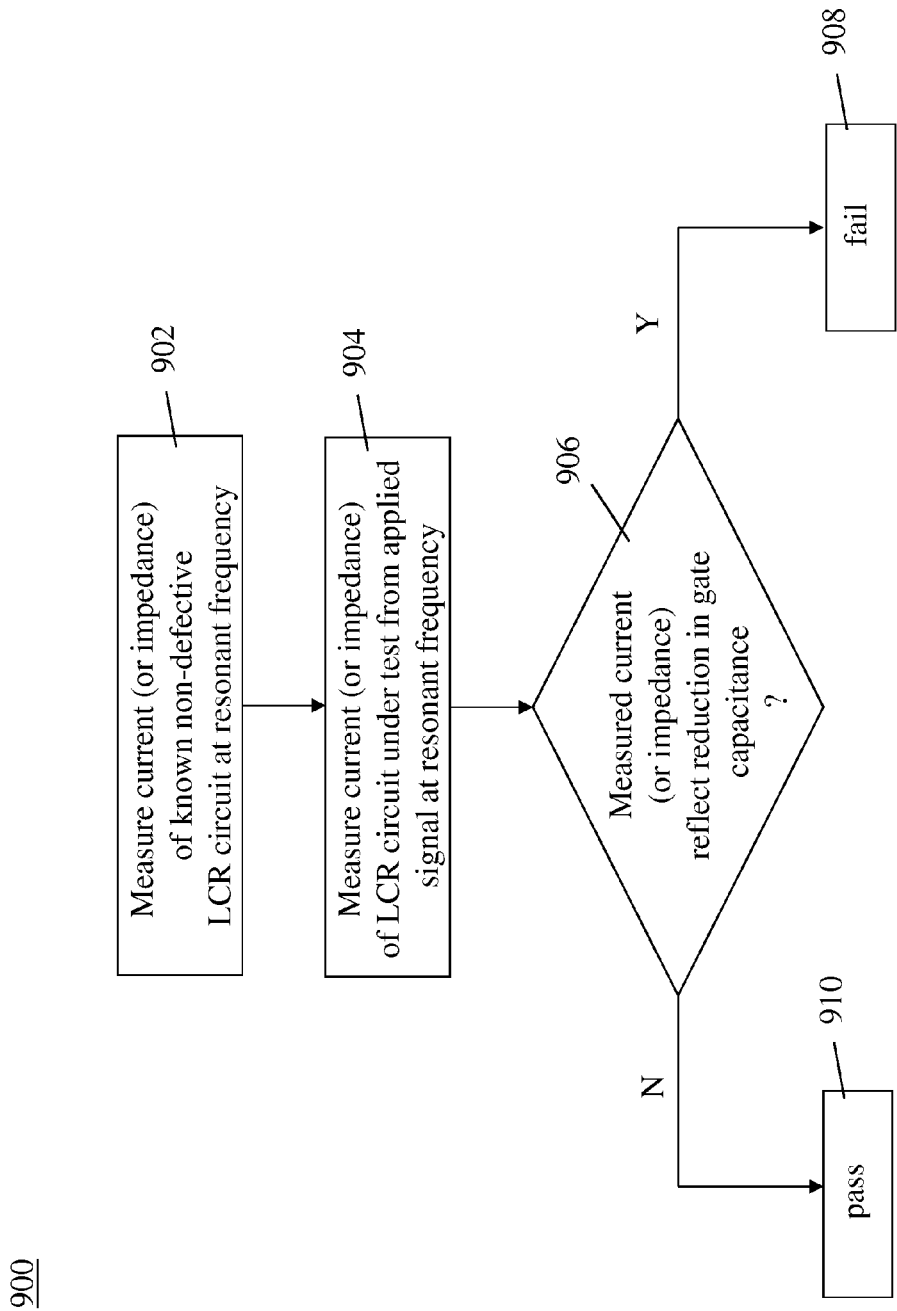
FIG. 9 is a flow diagram illustrating an exemplary method of testing for metal gate defects using an integrated series LCR circuit.

Finally, FIG. 9 is a flow diagram illustrating an exemplary method 900 of testing for metal gate defects using an integrated series LCR circuit. In block 902, a baseline current or impedance is established for a known, non-defective LCR circuit as described above by application of a suitable test signal, such as a voltage at the nominal resonant frequency, $\omega_0$, of the circuit. Once this is established, in block 904, the current or impedance is measured for an LCR circuit under test, from an applied signal at the same nominal resonant frequency, $\omega_0$. If at decision block 906 it is determined that the measured current or impedance for the test circuit reflects a reduction in gate capacitance, then the test outcome is a fail (block 908), presumptively due to a missing metal defect or the like. On the other hand, if there is no significant reduction in gate capacitance, then the circuit passes the test (block 910).

As will thus be appreciated, among the advantages of the disclosed embodiments include the capability of monitoring a gate capacitance change due to missing gate metal or silicide metal encroachment, and with the capability of discriminating between missing metal and missing polysilicon. Moreover, the test structure embodiments are suited for faster testing, as only a single input frequency may be used.

In view of the above, the present embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary methods described above and illustrated in FIG. 9.

While the disclosure has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the disclosure not be limited to the particular embodiment disclosed as the best mode contemplated for carrying out this invention, but that the invention will include all embodiments falling within the scope of the appended claims.

The invention claimed is:

1. A test structure for an integrated circuit device, comprising:
   a series inductor, capacitor, resistor (LCR) circuit including:
   one or more inductor elements, with each inductor element having at least one unit including a first segment formed in a first metal layer, a second segment connecting the first metal layer to a semiconductor substrate beneath the first metal layer, and a third segment formed in the semiconductor substrate, wherein the semiconductor substrate includes semiconductor material; and
   a capacitor element connected in series with each inductor element, each capacitor element defined by a transistor gate structure including a gate electrode as a first electrode, a gate dielectric layer, and the semiconductor substrate as a second electrode.

2. The test structure of claim 1, wherein the first segment of the inductor structure includes a substantially L-shaped wire structure formed in the first metal level region.

3. The test structure of claim 1, wherein the first segment of the inductor structure includes a spiral shaped wire structure formed in the first metal level region.

4. The test structure of claim 1, wherein the second segment of the inductor structure includes a vertically disposed contact area (CA) via connecting the first segment in the first metal layer to the third segment in the semiconductor substrate.

5. The test structure of claim 1, wherein the third segment of the inductor structure includes a substantially L-shaped doped region formed in the semiconductor substrate.

6. The test structure of claim 1, wherein the LCR circuit has an inductance value sufficient to enable detection of a change in capacitance due to a defective gate structure therein, with respect to a known, non-defective gate structure LCR circuit by application of a test signal at a resonant frequency of the non-defective gate structure LCR circuit.

7. The test structure of claim 6, wherein the inductance value, L, of the LCR circuit is such that the quantity $L/(R^2C)$ is on the order of about 100, wherein R is series resistance of the LCR circuit, and C is capacitance of the LCR circuit.

8. The test structure of claim 1, wherein the semiconductor substrate includes an RX region of the integrated circuit device.

9. A test structure for an integrated circuit device, comprising:
   an inductor, capacitor, resistor (LCR) circuit including a repeating plurality of series connected inductor-capacitor-resistor circuit elements,
   wherein each inductor element has at least one unit including a first segment formed in a first metal layer, a second segment connecting the first metal layer to a semiconductor substrate beneath the first metal layer, and a third segment formed in the semiconductor substrate,
   wherein each capacitor element is defined by a transistor gate structure including a gate electrode as a first electrode, a gate dielectric layer, and the semiconductor substrate as a second electrode, and
   wherein the LCR circuit has an inductance value sufficient to enable detection of a change in capacitance due to a defective gate structure therein, with respect to a known, non-defective gate structure LCR circuit by application of a test signal at a resonant frequency of the non-defective gate structure LCR circuit.

10. The test structure of claim 9, wherein the first segment of the inductor structure includes a substantially L-shaped wire structure formed in the first metal level region.

11. The test structure of claim 9, wherein the first segment of the inductor structure includes a spiral shaped wire structure formed in the first metal level region.

12. The test structure of claim 9, wherein the second segment of the inductor structure includes a vertically disposed contact area (CA) via connecting the first segment in the first metal layer to the third segment in the semiconductor substrate.

13. The test structure of claim 9, wherein the third segment of the inductor structure includes a substantially L-shaped doped region formed in the semiconductor substrate.

14. The test structure of claim 9, wherein the inductance value, L, of the LCR circuit is such that the quantity $L/(R^2C)$ is on the order of about 100, wherein R is series resistance of the LCR circuit, and C is capacitance of the LCR circuit.

15. A test structure for an integrated circuit device, comprising:
   a series inductor, capacitor, resistor (LCR) circuit including:
      one or more inductor elements, with each inductor element having at least one unit including a first segment formed in a first metal layer, a second segment connecting the first metal layer to a semiconductor substrate beneath the first metal layer, and a third segment formed in the semiconductor substrate; and
   a capacitor element connected in series with each inductor element, each capacitor element defined by a transistor gate structure including a gate electrode as a first electrode, a gate dielectric layer, and the semiconductor substrate as a second electrode,
   wherein the LCR circuit has an inductance value sufficient to enable detection of a change in capacitance due to a defective gate structure therein, with respect to a known, non-defective gate structure LCR circuit by application of a test signal at a resonant frequency of the non-defective gate structure LCR circuit.

* * * * *